United States Patent
Pommer et al.

(10) Patent No.: US 6,261,423 B1
(45) Date of Patent: *Jul. 17, 2001

(54) SPUTTERING PROCESS

(75) Inventors: Richard J. Pommer, Trabuco Canyon; Glen Roeters, Huntington Beach; Stephen M. Avery, Costa Mesa, all of CA (US)

(73) Assignee: Honeywell International Inc., MorrisTownship, NJ (US)

(*) Notice: Subject to any disclaimer, the term of this patent is extended or adjusted under 35 U.S.C. 154(b) by 0 days.

This patent is subject to a terminal disclaimer.

(21) Appl. No.: 09/664,868

(22) Filed: Sep. 19, 2000

Related U.S. Application Data

(63) Continuation of application No. 09/369,037, filed on Aug. 4, 1999, now Pat. No. 6,153,060.

(51) Int. Cl.⁷ .......................... C23C 14/00; C23C 14/34; C23C 14/22
(52) U.S. Cl. ................. 204/192.12; 204/192.1; 204/192.13; 204/192.14; 204/192.15; 204/192.2; 427/471; 427/96; 427/97; 427/99; 427/534; 427/536; 427/537; 427/248.1; 427/255.7; 427/533; 427/377; 427/314; 156/272.2; 156/272.6
(58) Field of Search ......................... 204/192.12, 192.1, 204/192.13, 192.14, 192.15, 192.2; 427/471, 96, 97, 99, 534, 536, 537, 248.1, 255.7, 533, 377, 314; 156/272.2, 272.6

(56) References Cited

U.S. PATENT DOCUMENTS

| | | | |
|---|---|---|---|
| 5,202,220 | * | 4/1993 | Park et al. .................... 430/276.1 |
| 5,525,369 | * | 6/1996 | Blackwell et al. ............. 204/192.14 |
| 5,840,161 | * | 11/1998 | Woodard et al. ............. 204/192.14 |
| 6,153,060 | * | 11/2000 | Pommer et al. ............... 204/192.12 |

FOREIGN PATENT DOCUMENTS

| | | | |
|---|---|---|---|
| 60-75835 | * | 4/1985 | (JP) . |
| 2-193341 | * | 7/1990 | (JP) . |

\* cited by examiner

Primary Examiner—Alan Diamond
(74) Attorney, Agent, or Firm—Curtis B. Brueske

(57) ABSTRACT

A method for coating substrates having sides of the substrate with unequal adhesion properties includes the steps of non-symmetrically coating the substrate by coating a first side under a first set of coating conditions and coating a second side under a second set of operating conditions wherein the operating conditions used to coat each side are varied so as to compensate for the unequal adhesion properties of the sides. Also, a method for substrate preparation comprising the steps of: providing an annealed thermoplastic substrate base layer having a first surface and a second surface; stabilizing the substrate base layer in an environment having a baseline temperature and relative humidity; drilling vias in the base layer; subjecting the first and second surfaces of the base layer to ion processing so as to remove contaminants caused by drilling the vias and to prepare the first and second surfaces for sputtering; metalizing the base layer by first sputtering at least one metal layer onto the first surface of the base layer and subsequently sputtering at least one metal layer onto the second surface of the base layer said sputtering of the metal layers being controlled so as to prevent the temperature of the base layer from exceeding the annealing temperature of the base layer; allowing the metalized base layer to stabilize in an environment having the baseline temperature and relative humidity and then subjecting the metalized base layer to further processing so as to modify the metal layers into conductive patterns.

11 Claims, 4 Drawing Sheets

US 6,261,423 B1

SPUTTERING PROCESS

This is a continuation of U.S. application Ser. No. 09/369,037, filed Aug. 4, 1999, now U.S. Pat. No. 6,153,060.

FIELD OF THE INVENTION

The field of the invention is two sided substrate coating via physical vapor deposition.

BACKGROUND OF THE INVENTION

An integrated circuit (IC) package is a housing which environmentally protects the IC, facilitates testing of the IC, and facilitates the use of the IC in high-yield assembly processes. Such a package functions to protect an IC from mechanical and environmental stresses and electrostatic discharge. It also functions to provide a mechanical interface for testing, burn-in, and interconnection to a higher level of packaging such as a circuit card.

In many IC packages a substrate acts as an interconnecting layer between the terminals or pads on the IC, and the connectors or leads of the package. The substrate is typically mechanically and electrically coupled to both the IC and the package leads. The substrate may be made from a ceramic or organic material, may be rigid or flexible, and may comprise a single layer or multiple layers laminated together.

A substrate typically has two substantially planar sides located on opposite sides of the substrate. A substrate may include conductive patterns located on one or both of the planar sides, and may include conductive through holes or vias to provide a conductive path through the substrate. Substrate fabrication may include the steps of providing a base layer such as a polyimide film, forming vias in the base layer, covering the planar surfaces of the base layer with one or more metal layers and filling the vias with conductive material, removing portions of the metal layers to form the conductive pattern, and possibly coupling the resulting substrate with additional substrates to form a multi-layer substrate.

The step of forming vias in the base layer may be accomplished through the use of laser drilling. Although laser drilling provides many benefits, it typically leaves surface contaminants ("laser slag") on the substrate surfaces. These surface contaminants are preferably removed prior to covering the surfaces with the metal layers. Although chemical and plasma cleaning methods are known, improvements in substrate cleaning have the potential of providing substantial economical and environmental savings.

The step of covering the surfaces of the base layer with one or more metal layers and filling the vias with conductive material is preferred to result in sufficient adhesion of the metal layers to the base layer so as to prevent future delamination. A measure of the ability to resist delamination is peel strength. Peel strength is typically measured as units of force per unit width such as lb/in or g/mm and is determined by measuring the amount of force required to peel a strip of the metal layer from the base layer.

Existing methods and devices sometimes produce an unsatisfactory result in that the resulting coated substrate suffer from relatively poor peel strength on one or more sides. Thus, it is desirable to develop new substrates having higher peel strengths, and methods and devices for producing such substrates.

SUMMARY OF THE INVENTION

The present invention is directed to improved substrates having higher, balanced peel strengths and methods and devices for producing such substrates. More specifically, a method particularly suited to coating substrates in which two sides of the substrate have unequal adhesion properties includes the steps of non-symmetrically coating the substrate by coating a first side under a first set of coating conditions and coating a second side under a second set of coating conditions wherein the coating conditions used to coat each side are varied so as to compensate for the unequal adhesion properties of the sides.

Also, a method for substrate preparation comprising the steps of: providing an annealed thermoplastic substrate base layer having a first surface and a second surface; stabilizing the substrate base layer in an environment having a baseline temperature and relative humidity; drilling vias in the base layer; subjecting the first and second surfaces of the base layer to ion processing so as to remove contaminants caused by drilling the vias and to prepare the first and second surfaces for sputtering; metalizing the base layer by first sputtering at least one metal layer onto the first surface of the base layer and subsequently sputtering at least one metal layer onto the second surface of the base layer said sputtering of the metal layers being controlled so as to prevent the temperature of the base layer from exceeding the annealing temperature of the base layer; allowing the metalized base layer to stabilize in an environment having the baseline temperature and relative humidity and then subjecting the metalized base layer to further processing so as to modify the metal layers into conductive patterns.

Various objects, features, aspects and advantages of the present invention will become more apparent from the following detailed description of preferred embodiments of the invention, along with the accompanying drawings in which like numerals represent like components.

DETAILED DESCRIPTION

Figure 1:
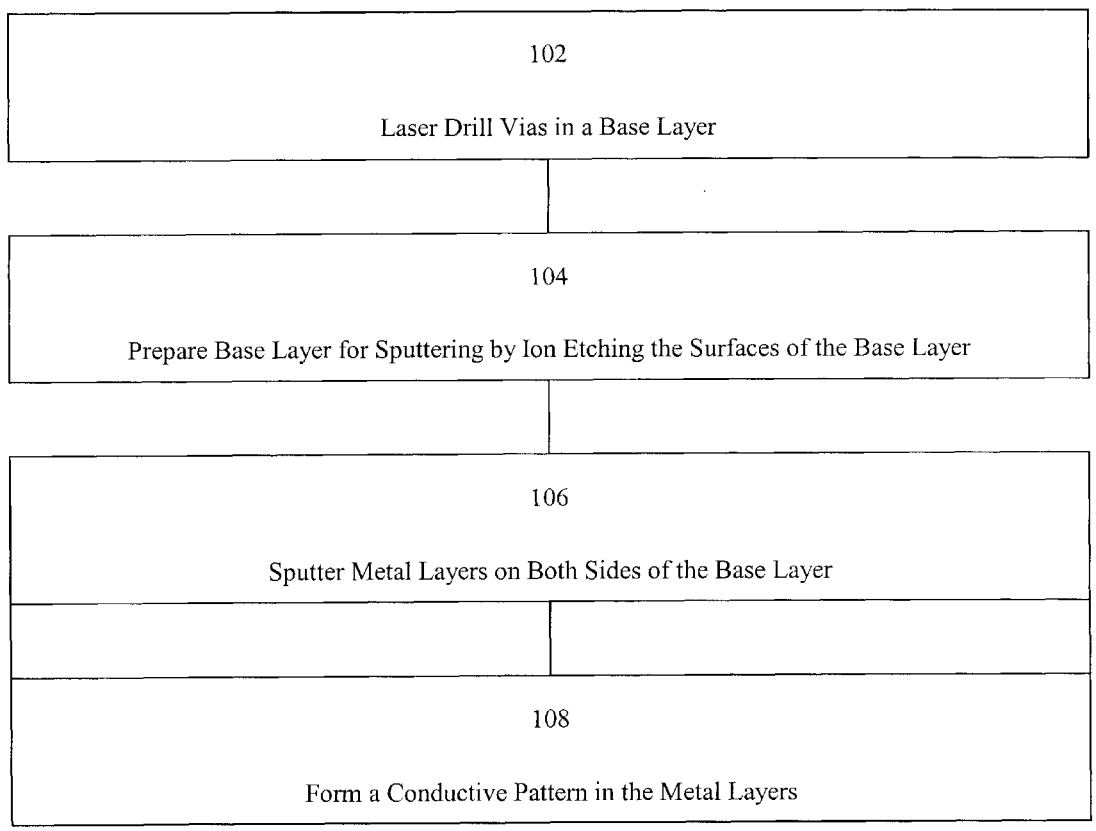
FIG. 1 is a block diagram of a first method embodying the invention.

Referring first to FIG. 1, a preferred method of forming a substrate comprises step 102, laser drilling vias in a dielectric base material such as Upilex® polyimide film, step 104, preparing the surface by ion etching, step 106, sputtering chromium and copper layers onto both sides of the film and into the vias, and step 108, using photolithography on the metal layers to form a desired conductive pattern. In trying to incorporate the method of FIG. 1 into a production environment, several problems arose the solutions to some of which comprise the inventive subject matter disclosed herein.

Step 102, laser drilling vias into the base material ("lasing") was found to leave a carbonaceous ring ("laser slag") around the entry hole of the via. Such rings are particularly troublesome in that there is little or no adhesion between the laser slag and the sputtered metal layers.

Including step 104, preparing the surface by ion etching, permits the use of one or more ion sources to remove the laser slag as well as other surface contaminants. The use of ion etching for these purposes potentially eliminates the need for chemical and/or plasma cleaning steps between lasing and sputtering steps, and promotes adhesion during step 106, sputtering metal onto the cleaned and prepared film. For the ion source(s) of step 104, it is preferred that a close drift device (a device having an electron current that passes through and is impeded by a magnetic field) be used. Even more preferably, an anode layer/gridless devices having a short acceleration zone would be used. Such a device can work without an electron emitter, has a simpler design and exhibits less electrical noise than a source with an extended acceleration zone, minimizes or eliminates particle contamination and is relatively maintenance-free. In a preferred embodiment, an Advanced Energy Industries, Inc. 94 cm Linear Ion Beam Source was used with Oxygen as a working gas, a gas flow pressure of 200 sccm (standard cubic centimeters per minute), a discharge voltage (which is function of gas flow) of 1500v for a 200 sccm gas flow. Further discussion of the benefits of ion beam processing are the subject of the inventors U.S. patent application titled "ION PROCESSING OF A SUBSTRATE" Ser. No. 09/369,032 pending, herein incorporated by reference in its entirety.

Once the vias have been drilled, all future processing must deal with the issue of how to assure proper registration between the vias and the conductive patterns on the surfaces of the film, as well as between conductive patterns on one layer with those of another. In attempting to assure proper registration during the various processing steps, several problems were identified and overcome. One such problem is the likelihood of distortion/improper alignment due to environmental changes such as changes in temperature and humidity during processing. Another at least somewhat unique to polyimide film and other thermoplastic materials was the likelihood of distortion caused by overheating of the substrate during sputtering. Yet another was differences in peel strengths between sides of a substrate as a result of the sides having differing surface characteristics.

In an attempt minimize registration problems resulting from temperature and humidity changes, the substrate base material was placed in an environment having a baseline temperature and humidity and allowed to stabilize in that environment prior to drilling the vias. Establishing a baseline environment assists in assuring proper registration between components. Such increased assurance results from re-stabilizing the substrate to the baseline temperature and humidity prior to a processing step so as to minimize any distortion caused by changes in temperature or humidity of the substrate from the baseline values. For a method including the steps of lasing, coating, photolithography, and laminating, it has been found beneficial to stabilize the substrate in a baseline environment prior to lasing, and to re-stabilize it prior to the photolithography and laminating steps.

Distortion caused by overheating of the substrate during sputtering (step 106) has been found to be limiting factor strongly affecting throughput. In general, increased deposition rates result in higher substrate temperatures during processing. Thus, to maintain a maximum processing temperature below the distortion temperature of the substrate requires limiting deposition rates with corresponding reductions in throughput. One method found to reduce or eliminate such distortions is by pre-annealing the substrate so as to raise the temperature at which distortion occurs. It is contemplated that pre-annealing the substrate to a temperature well beyond the typical annealing temperature will raise the temperature at which the substrate can be processed to be roughly equivalent to the annealing temperature used. Thus, incorporating an annealing step in the processing of polyimide film prior to step 102 lasing permits higher deposition rates. It is contemplated that temperatures in the range of 340°–400°, 360°–380°, 365°–375°, or 368°–372° may be particularly beneficial. Less preferred temperatures may fall below 340° C. or higher than 380° C. The currently preferred temperature is 372° C.

Another method found to reduce or eliminate such distortions is by sputtering the sides of the substrate sequentially rather than simultaneously. It was found that the temperature of the substrate was significantly higher for a given deposition rate when both sides are sputtered simultaneously than when they are sputtered sequentially. Thus, if the sides are sputtered separately, a higher deposition rate can be used than if they are sputtered simultaneously. If the substrate sides are to be sputtered sequentially, the substrates can be mounted with one side coupled to a heat sink during sputtering. Mounting the substrate such that one side is flush to an aluminum plate during sputtering was found to help reduce the temperature of the substrate during sputtering and thus to allow a higher deposition rate. It is contemplated that higher deposition rates may also contribute to improved peel strengths. Using a cooled aluminum plate (i.e. a plate that was placed in a freezer for several hours prior to use in the sputtering process) has been found to further reduce the temperature of the substrate during sputtering and thus to allow even higher deposition rates.

It was discovered that when the two sides are sputtered sequentially at the same rate, the temperature during sputtering of the second side is significantly higher than that while sputtering the first. The increased temperature while sputtering the second side can be taken advantage of in a couple of different ways. One way is to recognize that although the second side may need to be sputtered at a given rate because of the increase in temperature, the first side can be sputtered at a higher rate do to the relatively lower temperature. Thus, by customizing the deposition rate for each side, the overall throughput of the process can be increased.

It has been found that using sputtering to coat the sides of substrates such as polyimide film can result in the two coated sides having unequal peel strengths. Another way to take advantage of the temperature difference between sides is to choose to sputter the less adhesive side second, but at a rate similar to that of the first side. In doing so, it is contemplated that the increased temperature during second side sputtering will help to produce a more balanced substrate in that the relative lack of adhesiveness of the second side will be at least partially compensated for by the increased temperature. Thus, a substrate can be balanced so as to have more equal peel strengths by varying the operating conditions under which each of the surfaces is coated and possibly the order in which they are coated so as to compensate for the differences in adhesion properties between the sides. It is contemplated that the first set of operating conditions and the second set of operating conditions may differ in regard to at least one of system geometry, substrate temperature, target voltage, sputtering gas, gas pressure, and power.

In addition to polyimide film, it is recognized that the methods disclosed herein may be equally applicable any dielectric base material, particularly those having surface characteristics which differ between sides.

In one embodiment, a method for coating first and second surfaces of a substrate so as to produce a balanced substrate might include utilizing physical vapor deposition to deposit a first coating on the first surface of the substrate under a first set of operating conditions, and utilizing physical vapor deposition to deposit a second coating on the second surface of the substrate under a second set of operating conditions which differs substantially from the first set of operating conditions. As previously discussed, the operating conditions of the two deposition steps are preferably varied so as to compensate for the differences in adhesion properties of the two sides.

In an alternative embodiment, a method for coating first and second surfaces of a substrate so as to produce a balanced substrate might also include choosing a surface having a higher level of adhesion than another surface to be coated as the first surface, and then coating the first surface prior to coating the second surface.

Existing substrate coating methods frequently utilize a sputtered seed layer which is used to metalize the substrate by electroplating. It is contemplated that a substrate comprising a metal layer which is less than or equal to 5000 Angstroms thick and which is deposited solely by sputtering may be superior to one comprising a thicker and/or electroplated layer. It is also contemplated that the process disclosed herein, in particular ion etching the surface prior to sputtering allows for relatively thin coating layers which are substantially uniform and free from defects. Such thinly sputtered layers are thought to allow finer conductive traces to be etched, and possibly also to improve peel strength. Using the methods disclosed herein, acceptable substrates having a metal coating on a side (the coating comprising all the sputtered layers) which is less than 4000 Angstroms, 3000 Angstrom, 2000 Angstroms, less than 1000 Angstroms or even less than or equal to 100 Angstroms can be achieved.

Figure 4:
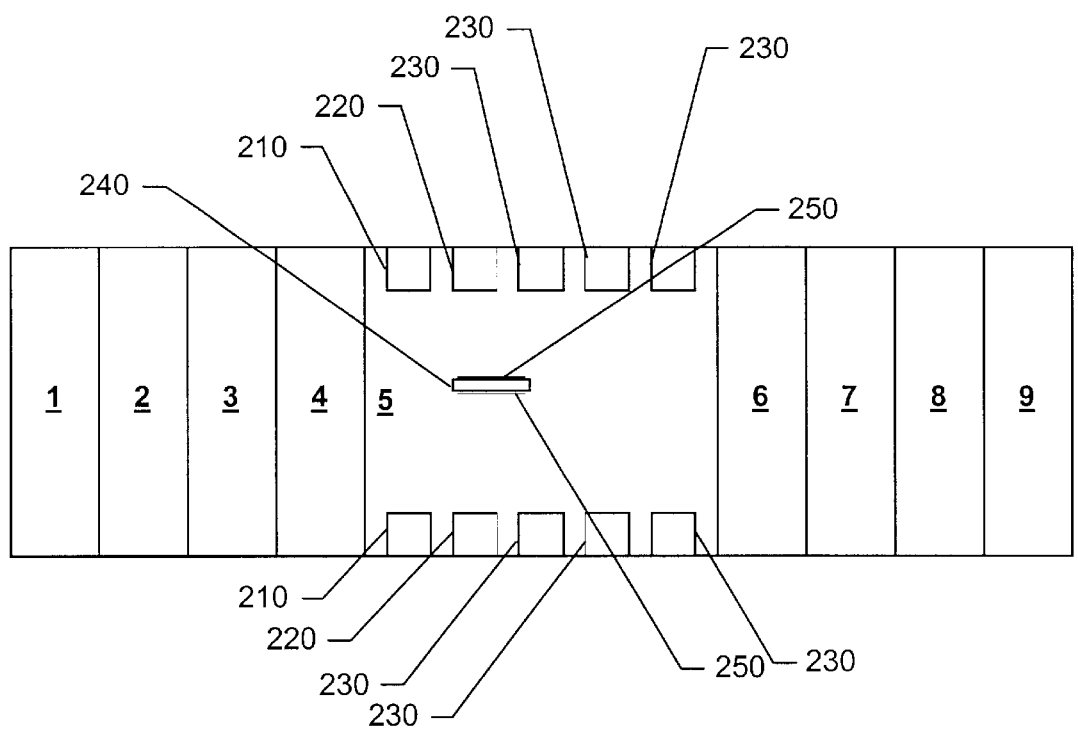
FIG. 4 is a schematic of a sputtering system embodying the invention.

The methods disclosed herein might also be applied to modified versions of existing sputtering systems such as Balzers Process Systems (BPS) Aristo™ 500S vertical in-line sputtering system for Flat Panel Displays. Referring to FIG. 4, although previously used only to sputter a single side of a flat panel display, such a system can be modified system to comprise a substrate carrier having a substrate attachment plate 240 and a release latch which allows removal of the attachment plate, ion sources 210, as previously discussed, to provide a high energy directed plasma source to clean and texture the film surface immediately before metalization, and a series of modules arranged linearly (and numbered in ascending order from start to finish) wherein the end modules (modules 1 and 9) allow for atmospheric for loading and unloading, modules 2 and 8 cycle between atmospheric pressure and rough vacuum levels and act as load locks, modules 3 and 7 cycle between rough vacuum levels of the load locks, and the high vacuum levels of the process chambers, and modules 4–6 are continuous (modules 1–3 and 7–9 are each discontinuous/ physically separated to allow for differing vacuum levels) and include the cathodes (220 and 230) and process which are in module 5, and additional space in modules 4 and 6 for the carrier to move past the cathodes for complete sputter coverage of the substrate panels. In module 5 there is at least one pair of ion sources, at least one pair of chromium cathodes, and at least one pair of copper cathodes, with the paired sources are mounted on opposing walls facing inward.

A modified BPS system as described may be used to simultaneously sputter both sides of a substrate by (1) mounting two or more substrates 250 side by side and separated by a shield 240 (the attachment plate), (2) passing the mounted substrates 250 through a sputtering chamber (module 5) to coat a first side of each substrate (and possibly to ion etch the substrate prior to coating), (3) repositioning the substrates so that the second, uncoated sides face outwards, and then (4) passing the substrates through the same or a second chamber to coat the second sides of each substrate. It should be noted that mounting substrates 250 directly to shield 240 allows shield 240 to act as a heat sink as well as protecting one side of the substrates 250 against sputtering.

Figure 2:
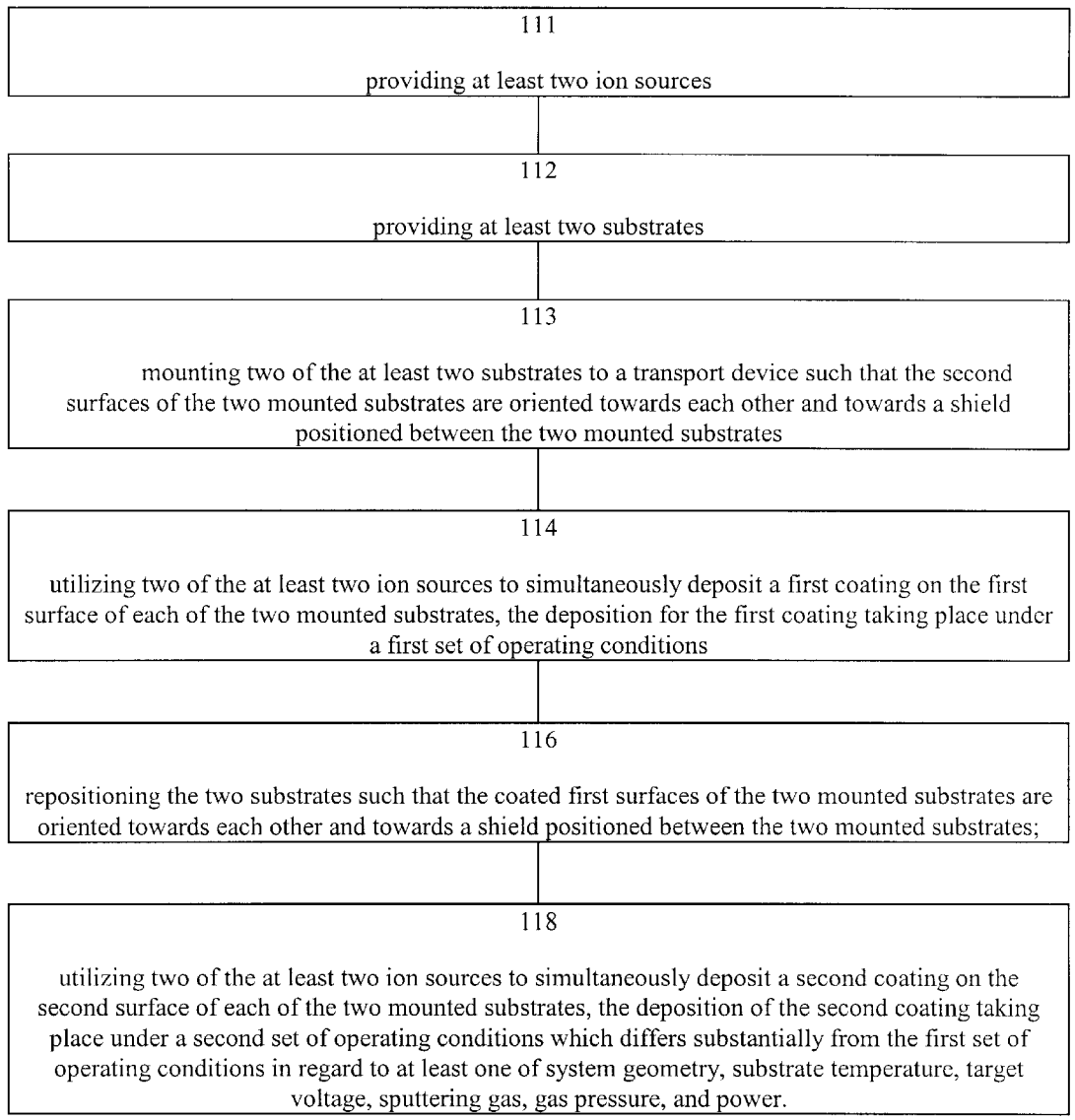
FIG. 2 is a block diagram of a second method embodying the invention.

Referring to FIG. 2, a method describing this process might be said to include the step 111, providing at least two sputtering cathodes (or some other physical vapor deposition device); step 112, providing at least two substrates; step 113, mounting two of the at least two substrates to a transport device such that the second surfaces of the two mounted substrates are oriented towards each other and towards a shield positioned between the two mounted substrates; step 114, utilizing two of the at least two sputtering cathodes to simultaneously deposit a first coating on the first surface of each of the two mounted substrates, the deposition for the first coating taking place under a first set of operating conditions; step 116, repositioning the two substrates such that the coated first surfaces of the two mounted substrates are oriented towards each other and towards a shield positioned between the two mounted substrates; step 118, utilizing two of the at least two sputtering cathodes to simultaneously deposit a second coating on the second surface of each of the two mounted substrates, the deposition of the second coating taking place under a second set of operating conditions which differs substantially from the first set of operating conditions in regard to at least one of system geometry, substrate temperature, target voltage, sputtering gas, gas pressure, and power.

Figure 3:
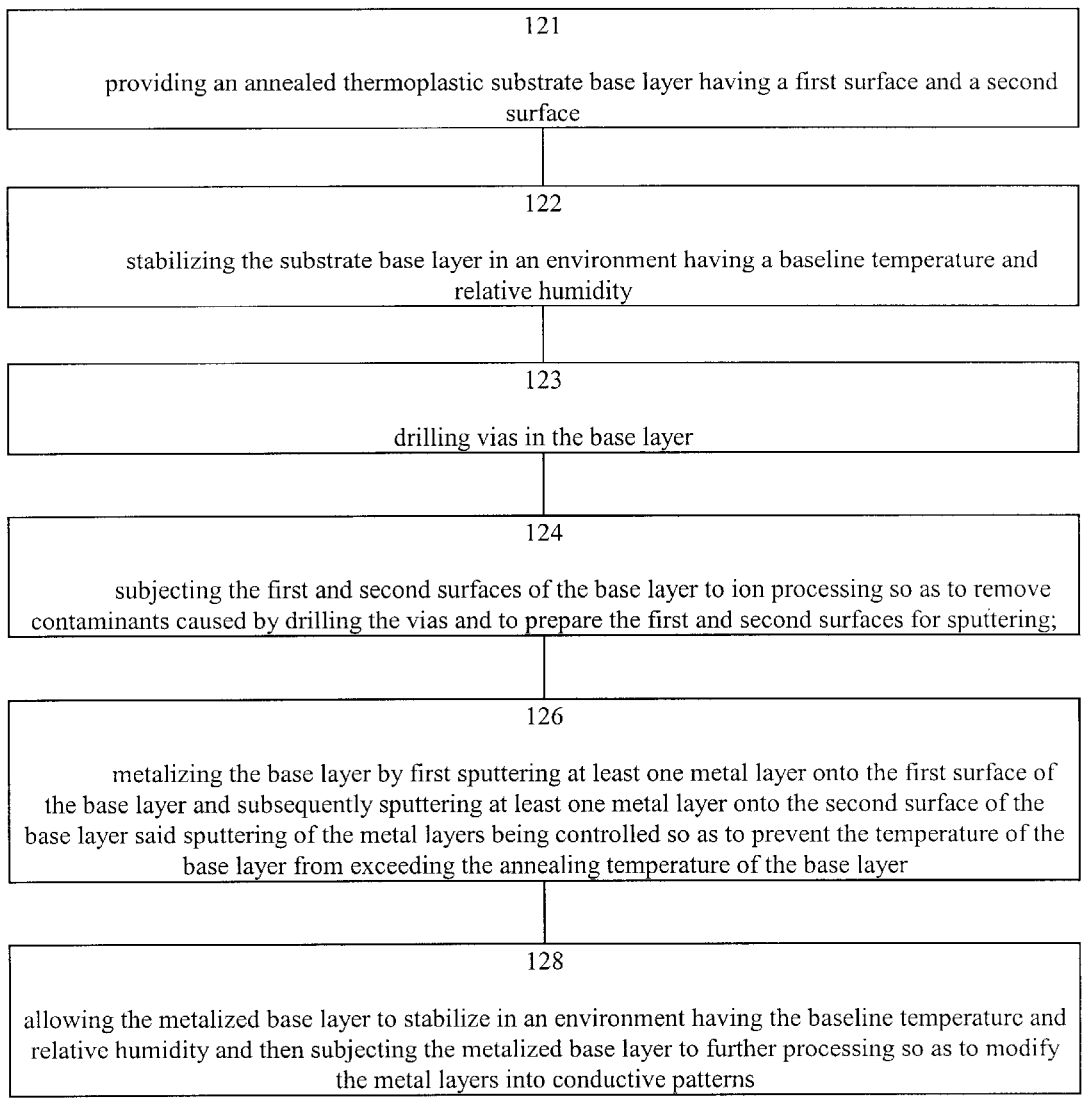
FIG. 3 is a block diagram of a third method embodying the invention.

Referring to FIG. 3, an alternative method describing this process might be said to include the steps of: step 121, providing an annealed thermoplastic substrate base layer having a first surface and a second surface; step 122, stabilizing the substrate base layer in an environment having a baseline temperature and relative humidity; step 123, drilling vias in the base layer; step 124, subjecting the first and second surfaces of the base layer to ion processing so as to remove contaminants caused by drilling the vias and to prepare the first and second surfaces for sputtering; step 126, metalizing the base layer by first sputtering at least one metal layer onto the first surface of the base layer and subsequently sputtering at least one metal layer onto the second surface of the base layer said sputtering of the metal layers being controlled so as to prevent the temperature of the base layer from exceeding the annealing temperature of the base layer; step 128, allowing the metalized base layer to stabilize in an environment having the baseline temperature and relative humidity and then subjecting the metalized base layer to further processing so as to modify the metal layers into conductive patterns.

Thus, specific embodiments and applications of sputtering systems and methods for processing a substrate have been disclosed. It should be apparent, however, to those skilled in the art that many more modifications besides those already described are possible without departing from the inventive concepts herein. The inventive subject matter, therefore, is not to be restricted except in the spirit of the appended claims. Moreover, in interpreting both the specification and the claims, all terms should be interpreted in the broadest possible manner consistent with the context. In particular, the terms "comprises" and "comprising" should be interpreted as referring to elements, components, or steps in a non-exclusive manner, indicating that the referenced elements, components, or steps may be present, or utilized, or combined with other elements, components, or steps that are not expressly referenced.

What is claimed is:

1. A method for coating two surfaces of a substrate, comprising the steps of:
   recognizing that the substrate comprises a first surface having a higher level of adhesion than a second surface; and
   depositing a coating onto the first surface under a first set of operating conditions and depositing a coating onto the second surface under a second set of operating conditions which differs from the first set of operating conditions.

2. The method of claim 1 wherein the first set of operating conditions and the second set of operating conditions differ in regard to at least one of system geometry, substrate temperature, target voltage, sputtering gas, gas pressure, and power.

3. The method of claim 1 wherein the first set of operating conditions and the second set of operating conditions differ in regard to at least two of system geometry, substrate temperature, target voltage, sputtering gas, gas pressure, and power.

4. The method of claim 2 wherein the coating deposited on at least one surface comprises a plurality of metal layers.

5. The method of claim 4 wherein deposition of the at least one coating comprising a plurality of metal layers is controlled so as to prevent the thickness of the at least one coating from exceeding N Angstroms where N is 5000.

6. The method of claim 4 wherein deposition of the at least one coating comprising a plurality of metal layers is controlled so as to prevent the thickness of the at least one coating from exceeding N Angstroms where N is 4000.

7. The method of claim 4 wherein deposition of the at least one coating comprising a plurality of metal layers is controlled so as to prevent the thickness of the at least one coating from exceeding N Angstroms where N is one of 3000, 2000, and 1000.

8. The method of claim 4 wherein deposition of the at least one coating comprising a plurality of metal layers is controlled so as to prevent the thickness of the at least one coating from exceeding N Angstroms where N is 100.

9. The method of claim 8 wherein deposition of the at least one coating is accomplished via sputtering.

10. The method of claim 1 wherein the substrate is a polyimide film.

11. A method for coating two surfaces of a substrate, comprising the steps of:
    recognizing that the substrate comprises a first surface having a higher level of adhesion than a second surface; and
    sputtering a coating onto the first surface prior to depositing a coating onto the second surface.

* * * * *